United States Patent
Lin

(10) Patent No.: US 10,101,389 B2
(45) Date of Patent: Oct. 16, 2018

(54) POWER CONFIGURATION VERIFICATION OF POWER-MANAGEMENT SYSTEM

(71) Applicant: MediaTek Inc., Hsin-Chu (TW)

(72) Inventor: Jian-Wei Lin, Zhubei (TW)

(73) Assignee: MEDIATEK INC., Hsin-Chu (TW)

( * ) Notice: Subject to any disclaimer, the term of this patent is extended or adjusted under 35 U.S.C. 154(b) by 337 days.

(21) Appl. No.: 14/993,364

(22) Filed: Jan. 12, 2016

(65) Prior Publication Data

US 2016/0218504 A1 Jul. 28, 2016

Related U.S. Application Data

(60) Provisional application No. 62/108,163, filed on Jan. 27, 2015.

(51) Int. Cl.
| | |
|---|---|
| *G01R 31/3177* | (2006.01) |
| *G06F 11/25* | (2006.01) |
| *G06F 17/50* | (2006.01) |
| *G01R 31/40* | (2014.01) |
| *G01R 31/317* | (2006.01) |

(Continued)

(52) U.S. Cl.
CPC ... *G01R 31/3177* (2013.01); *G01R 31/31704* (2013.01); *G01R 31/40* (2013.01); *G06F 11/25* (2013.01); *G06F 17/5022* (2013.01); *H02J 1/08* (2013.01); *H02J 1/14* (2013.01); *G06F 1/3203* (2013.01)

(58) Field of Classification Search
CPC .......... G01R 31/3177; G01R 31/31704; G01R 31/40; G06F 17/5022; G06F 11/25; G06F 1/3203; G06F 1/26
See application file for complete search history.

(56) References Cited

U.S. PATENT DOCUMENTS

| | | | |
|---|---|---|---|
| 8,154,315 B2 | 4/2012 | Henson et al. | |
| 8,195,995 B2 * | 6/2012 | Janke | H01L 23/576 |
| | | | 714/728 |

(Continued)

FOREIGN PATENT DOCUMENTS

| | | |
|---|---|---|
| CN | 1932721 A | 3/2007 |
| CN | 102055236 A | 5/2011 |

(Continued)

*Primary Examiner* — Ryan Johnson
(74) *Attorney, Agent, or Firm* — McClure, Qualey & Rodack, LLP

(57) ABSTRACT

A method for verifying a power-management system including a controller and a plurality of power devices, wherein the controller receives a plurality of input signals to generate a plurality of control signals to control the power devices, includes: determining each of the power devices operating in a corresponding mode when the power-management operates under a power configuration; determining a target combination of the control signals when each of the power devices operates in the corresponding mode; patternlessly verifying a behavior of the controller with an input combination of the input signals for the power-management system operating under the power configuration to generate a calculated result of the control signals; comparing the calculated result to the target combination; and determining that the input combination is valid when the calculated result is equal to the target combination.

24 Claims, 3 Drawing Sheets

(51) Int. Cl.
*H02J 1/08* (2006.01)
*H02J 1/14* (2006.01)
*G06F 1/32* (2006.01)

(56) References Cited

U.S. PATENT DOCUMENTS

2010/0250974 A1* 9/2010 Ristic ................... G06F 1/3203
 713/300
2012/0159274 A1* 6/2012 Balakrishnan ... G01R 31/31703
 714/732

FOREIGN PATENT DOCUMENTS

| | | |
|---|---|---|
| CN | 103430266 A | 12/2013 |
| TW | 201135434 A | 10/2011 |
| TW | I407302 B | 9/2013 |
| TW | 201503525 A | 1/2015 |

\* cited by examiner

POWER CONFIGURATION VERIFICATION OF POWER-MANAGEMENT SYSTEM

CROSS REFERENCE TO RELATED APPLICATIONS

This application claims the benefit of U.S. Provisional Application No. 62/108,163, filed on Jan. 27, 2015, the entirety of which is incorporated by reference herein.

BACKGROUND OF THE INVENTION

Field of the Invention

The disclosure relates generally to methods and devices for verifying a power-management system, and more particularly it relates to methods and devices for verifying a power-management system faster and more easily.

Description of the Related Art

With the rapid progress in the field of electrical devices, an electronic device requires more power supplies than before, such that a power-management system that includes more power channels is urgently needed. However, the more power devices a power-management system has, the more complicated it is to control each power device. Therefore, a controller that is configured to control each power channel in a power-management system makes it much more complicated to control the rapidly increasing number of required power channels.

In addition, as the controller in a power-management system gets more complicated, it requires much more time and resources to verify whether the control logic of the controller is valid or not. Therefore, a much more effective way to verify the control logic of the controller is urgently needed.

BRIEF SUMMARY OF THE INVENTION

For solving the problems described above, the invention provides a method for verifying a power-management system comprising a controller and a plurality of power devices, wherein the controller receives a plurality of input signals to generate a plurality of control signals to control the power devices, which includes: determining each of the power devices operating in a corresponding mode when the power-management operates under a power configuration; determining a target combination of the control signals when each of the power devices operates in the corresponding mode; patternlessly verifying a behavior of the controller with an input combination of the input signals for the power-management system operating under the power configuration to generate a calculated result of the control signals; comparing the calculated result to the target combination; and determining that the input combination is valid when the calculated result is equal to the target combination.

An embodiment of the method further includes: determining that the input combination is invalid when the calculated result is not equal to the target combination; and modifying either the input combination or the behavior of the controller to make the calculated result equal to the target combination.

In an embodiment of the method, the step of patternlessly verifying the behavior of the controller comprises: generating a logic equation equivalent to the behavior of the controller; determining the input combination of the input signals for the power-management system operating under the power configuration; and generating the calculated result of the control signals according to the logic equation and the input combination.

In an embodiment of the method, the logic equation models the behavior that the controller receives the input signals to generate the corresponding control signals.

In an embodiment of the method, the logic equation is generated according to a logic function of the controller.

In an embodiment of the method, the step of determining the target combination of the control signals includes: accessing a lookup table, wherein the lookup table lists all operation modes of each of the power devices and the corresponding control signals; and determining the target combination by the lookup table and the corresponding mode.

In an embodiment of the method, each of the power devices is either a power switch or a voltage regulator.

In an embodiment of the method, the voltage regulator is a low-dropout regulator or a DC-DC switched-mode voltage regulator.

The invention also provides a method for verifying a power-management system comprising a controller, a first power device and a second power device, wherein the controller receives a plurality of input signals to generate a plurality of first control signals to control the first power device and to generate a plurality of second control signals to control the second power device, which includes: determining the first power device operating in a first mode and the second power device operating in a second mode when the power-management operates under a power configuration; determining a first target combination of the first control signals when the first power device operates in the first mode; determining a second target combination of the second control signals when the second power device operates in the second mode; patternlessly verifying a behavior of the controller with an input combination of the input signals for the power-management system operating under the power configuration to generate a first calculated result of the first control signals and a second calculated result of the second control signals; comparing the first calculated result to the first target combination; comparing the second calculated result to the second target combination; and determining that the input combination is valid when the first and second calculated results are respectively equal to the first and second target combinations.

In an embodiment, the method further includes: determining that the input combination is invalid when either the first calculated result or the second calculated result is not equal to the corresponding first and second target combinations; and modifying either the input combination or the behavior of the controller to make the first calculated result and the second calculated result respectively equal to the first target combination and the second target combination.

In an embodiment of the method, the step of patternlessly verifying the behavior of the controller includes: generating a logic equation equivalent to the behavior of the controller; determining the input combination of the input signals for the power-management system operating under the power configuration; generating the first calculated result of the first control signals according to the logic equation and the input combination; and generating the second calculated result of the second control signals according to the logic equation and the input combination.

In an embodiment of the method, the logic equation models the behavior that the controller receives the input signals to generate the corresponding first and second control signals.

In an embodiment of the method, the step of determining the first target combination of the first control signals includes: accessing a first lookup table, wherein the first lookup table lists all operation modes of the first power devices and the corresponding first control signals; and determining the first target combination by the first lookup table and the corresponding first mode.

In an embodiment of the method, the step of determining the second target combination of the second control signals includes: accessing a second lookup table, wherein the second lookup table lists all operation modes of the second power devices and the corresponding second control signals; and determining the second target combination by the second lookup table and the corresponding second mode.

In an embodiment of the method, each of the first and second power devices is either a power switch or a voltage regulator.

In an embodiment of the method, the voltage regulator is a low-dropout regulator or a DC-DC switched-mode voltage regulator.

The invention further provides a verification device, which includes a power-management system and a microprocessor. The power-management system operates under a power configuration, wherein the power-management system includes a controller, a first power device, and a second power device. The controller receives a plurality of input signals to generate a plurality of first control signals and a plurality of second control signals. The first power device operates in a first mode according to the first control signal. The second power device operates in a second mode according to the second control signals. The microprocessor determines a first target combination of the first control signals when the first power device operates in the first mode, determines a second target combination of the second control signals when the second power device operates in the second mode, patternlessly verifies a behavior of the controller with an input combination of the input signals for the power-management system operating under the power configuration to generate a first calculated result of the first control signals and a second calculated result of the second control signals, compares the first calculated result to the first target combination, compares the second calculated result to the second target combination, and determines that the input combination is valid when the first and second calculated results are respectively equal to the first and second target combinations.

In an embodiment of the verification device, the microprocessor determines that the input combination is invalid when either the first calculated result or the second calculated result is not equal to the corresponding first and second target combinations, and modifies either the input combination or the behavior of the controller to make the first calculated result and the second calculated result respectively equal to the first target combination and the second target combination.

In an embodiment of the verification device, the microprocessor generates a logic equation equivalent to the behavior of the controller, determines the input combination of the input signals for the power-management system operating under the power configuration, generates the first calculated result of the first control signals according to the logic equation and the input combination, and generates the second calculated result of the second control signals according to the logic equation and the input combination.

In an embodiment of the verification device, the logic equation models the behavior that the controller receives the input signals to generate the corresponding first and second control signals.

In an embodiment of the verification device, the microprocessor further accesses a first lookup table and determines the first target combination by the first lookup table and the corresponding first mode, wherein the first lookup table lists all operation modes of the first power devices and the corresponding first control signals.

In an embodiment of the verification device, the microprocessor further accesses a second lookup table and determines the second target combination by the second lookup table and the corresponding second mode, wherein the second lookup table lists all operation modes of the second power devices and the corresponding second control signals.

In an embodiment of the verification device, each of the first and second power devices is either a power switch or a voltage regulator.

In an embodiment of the verification device, the voltage regulator is a low-dropout regulator or a DC-DC switched-mode voltage regulator.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
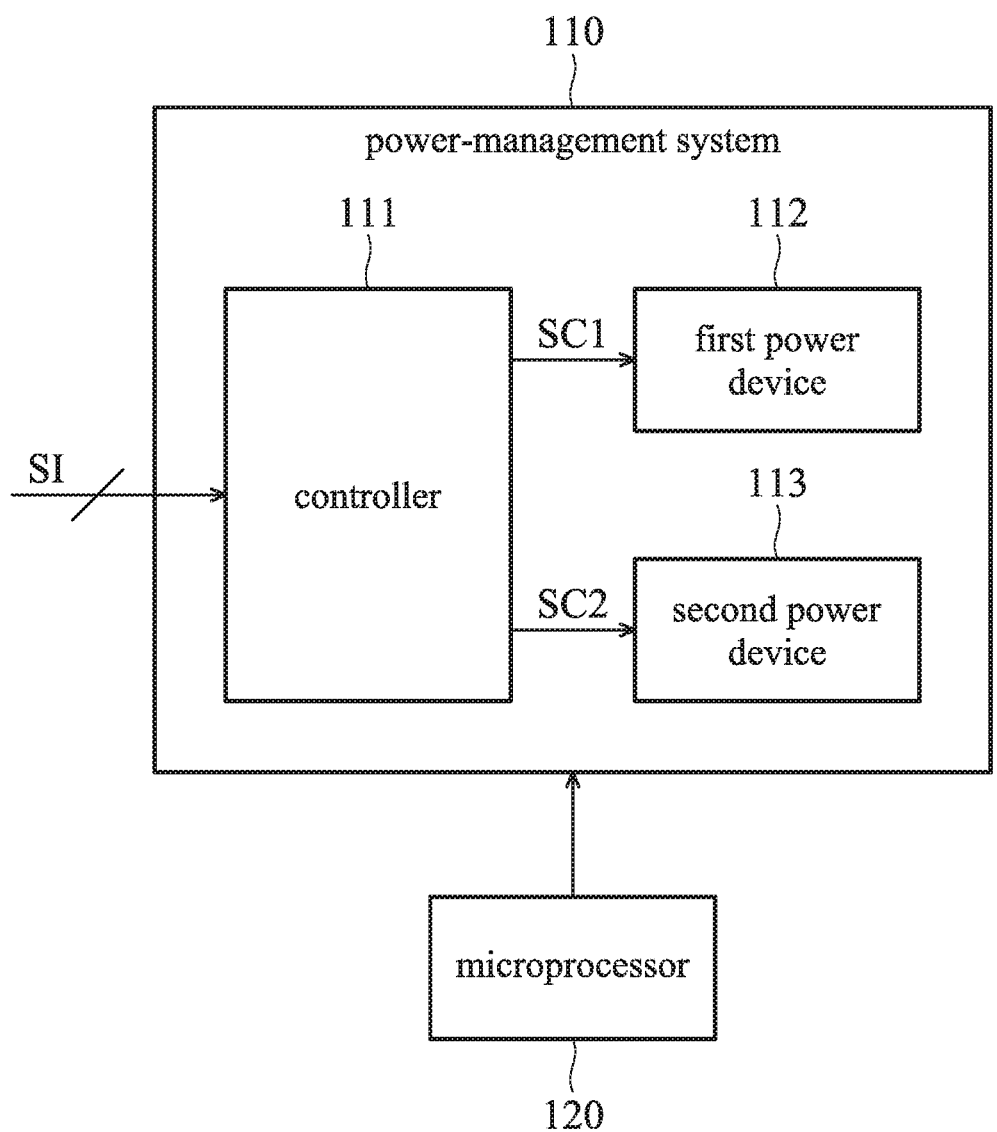
FIG. 1 is a block diagram of a verification device in accordance with an embodiment of the invention.

FIG. 1 is a block diagram of a verification device in accordance with an embodiment of the invention. As shown in FIG. 1, the verification device 100 includes the power-management system 110 and the microprocessor 120. The power-management system 110 includes the controller 111, the first power device 112, and the second power device 113. The controller 111 receives the input signal SI to generate the first control signal SC1 to control the first power device 112 and to generate the second control signal SC2 to control the second power device 113. According to an embodiment of the invention, the input signal SI is a single input signal. According to another embodiment of the invention, the input signal SI is a signal bus including a plurality of input signals.

According to an embodiment of the invention, the first power device 112 operates in a plurality of first modes according to the first control signal SC1. According to an embodiment, the first control signal SC1 is a signal bus including a plurality of first control signals to control the first power device 112 to operate in a plurality of first modes.

According to another embodiment of the invention, the first control signal SC1 is a single control signal.

According to an embodiment of the invention, the second power device 113 operates in a plurality of second modes according to the second control signal SC2. According to an embodiment, the second control signal SC2 is a signal bus including a plurality of second control signals to control the second power device 113 to operate in a plurality of second modes. According to another embodiment of the invention, the second control signal SC2 is a single control signal. In the following description, the first control signal SC1 and the second control signal SC2 are illustrated as a signal bus including a plurality of control signals.

After designing the power-management system, the control logic of the controller 111 should be verified. The microprocessor 120 is configured to verify the control logic of the controller 111. According to an embodiment of the invention, the microprocessor 120 is a computer with the design verification tool, such as a pattern-less verification tool.

According to an embodiment of the invention, each of the first power device 112 and the second power device 113 is either a power switch or a voltage regulator. According to an embodiment of the invention, the voltage regulator is a low-dropout (LDO) regulator or a switched-mode regulator. According to an embodiment of the invention, the switched-mode regulator is a buck, a boost, or a buck-boost. According to another embodiment of the invention, the switched-mode regulator is a DC-DC switched-mode regulator. According to yet another embodiment of the invention, the switched-mode regulator is any kind of switched-mode regulator which requires mode selection. It is noted that number of two power devices which included in the power-management system 110 is an exemplary embodiment, but not limited.

Figure 2:
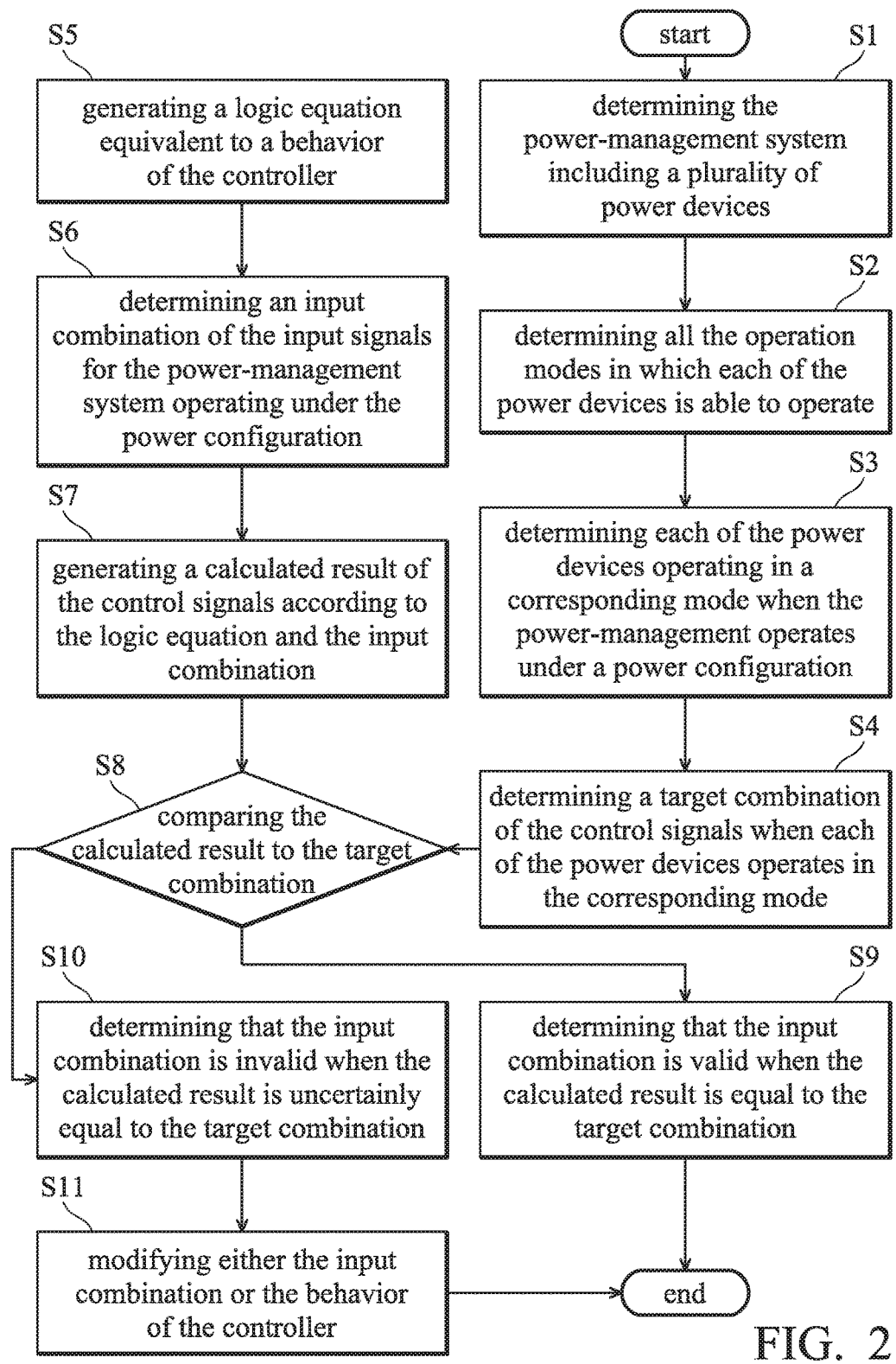
FIG. 2 is the flow chart of a method for verifying the controller in FIG. 1 in accordance with an embodiment of the invention.

FIG. 2 is the flow chart of a method for verifying the controller in FIG. 1 in accordance with an embodiment of the invention. In the following description, the flow chart in FIG. 2 is explained with FIG. 1. First, the microprocessor 120 determines that the power-management system 110 includes the first power device 112 and the second power device 113 (Step S1). The microprocessor 120 further determines all the operation modes in which the first power device 112 is able to operate, and determines all the operation modes in which the second power device 113 is to operate (Step S2).

When the power-management system 110 operates under a power configuration, the microprocessor 120 determines that the first power device 112 operates in a first mode and the second power device 113 operates in a second mode (Step S3). The microprocessor 120 determines a first target combination of the first control signal SC1 to operate the first power device 112 in the first mode, and determines a second target combination of the second control signal SC2 to operate the second power device 113 in the second mode (Step S4).

According to an embodiment of the invention, there is a first lookup table listing all operation modes of the first power device 112 and its corresponding first control signal SC1. The microprocessor 120 accesses the first lookup table to determine the first target combination for operating the first power device 112 in the first mode.

According to the embodiment of the invention, there is a second lookup table listing all the operation modes of the second power device 113 and its corresponding second control signal SC2. The microprocessor 120 accesses the second lookup table to determine the second target combination for operating the second power device 113 in the second mode.

In Step S5, the microprocessor 120 generates a logic equation equivalent to the behavior of the controller 111. According to an embodiment of the invention, since the controller 111 is a logic circuit which converts the input signal SI to the first control signal SC1 and the second control signal SC2, the microprocessor 120 generates the logic equation to model the relationship of the controller 111 receiving the input signal SI to generate the first control signal SC1 and the second control signal SC2.

After generating the logic equation, the microprocessor 120 determines an input combination of the input signal SI for the power-management system 110 operating under the power configuration (Step S6). Then, the microprocessor 120 generates the first calculated result of the first control signal SC1 and the second calculated result of the second control signal SC2 by inserting the input combination into the logic equation (Step S7). According to an embodiment of the invention, Steps S5~S7 are called the patternless verification.

The microprocessor 120 compares the first calculated result to the first target combination and the second calculated result to the second target combination to determine whether the input combination is valid (Step S8). When the first and second calculated results are respectively equal to the first and second target combinations, the microprocessor 120 determines that the input combination is valid (Step S9). When either the first calculated result or the second calculated result is not equal to the corresponding first and second target combinations, the microprocessor 120 determines that the input combination is invalid (Step S10). Then, the microprocessor 120 issues a notification to modify either the input combination or the behavior of the controller 111 (Step S11).

According to an embodiment of the invention, when the input combination is determined as invalid, the microprocessor 120 notifies the designer to modify the input combination to generate another first calculated result and another second calculated result for ensuring that the first and second target combinations are obtained. According to another embodiment of the invention, when the input combination is determined as invalid, the microprocessor 120 notifies the designer to modify the behavior of the controller 111 for ensuring that the first and second target combinations are obtained.

According to an embodiment of the invention, after modifying either the input combination or the behavior of the controller 111, the microprocessor 120 goes back to Step S5 to generate another logic equation equivalent to the behavior of the controller 111, or goes back to Step S6 to determine another input combination of the input signal SI, in order to make sure that the first power device 112 operates in the first mode and the second power device 113 operates in the second mode when the power-management system 110 operates under the power configuration.

For the sake of explaining the invention further, an example is illustrated in the following paragraphs. It is assumed that the first power device 112 operates in a first mode L1 and the second power device 113 operates in second mode L2 when the power-management system 110 operates under the power configuration SP. In addition, the input signal SI is a signal bus which includes the first signal X1, second signal X2, third signal X3, and fourth signal X4, but only the first signal X1 and the second signal X2 are configured to determine the first control signal SC1 and the second control signal SC2.

TABLE 1

| SC1 | SC2 | power-management system 110 | first power device 112 | second power device 113 |
|---|---|---|---|---|
| 1 | 0 | SP | L1 | L2 |

Table 1 shows the truth table of the first control signal SC1 and the second control signal SC2 corresponding to the power-management system 110 operating under the power configuration SP, the first power device 112 operating in a first mode L1 and the second power device 113 operating in second mode L2. In Step S3 of FIG. 2, the microprocessor 120 determines that the first control signal SC1 is a binary value of "1" for the first power device 112 operating in the first mode L1 and the second control signal SC2 is a binary value of "0" for the second power device 113 operating in the second mode L2, such that the power-management system 110 operates under the power configuration SP.

In Step S5 of FIG. 2, the microprocessor 120 generates a logic equation equivalent to the behavior of the controller 111 and the logic equation is SC1=(X1×X2)+(X3×X4), which models the relationship of the controller 111 receiving the input signal SI to generate the first control signal SC1.

Figure 3:
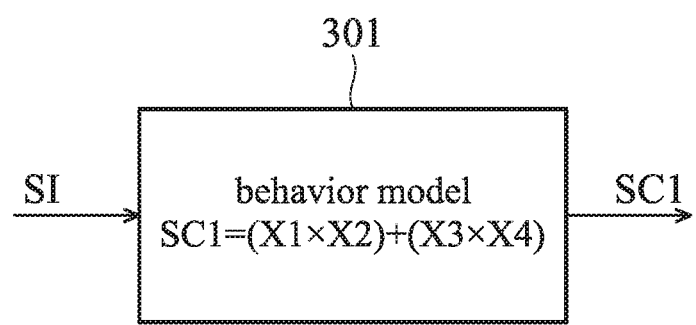
FIG. 3 shows a behavior model of the relationship between the input signal SI and the first control signal SC1 in accordance with the embodiment of the invention.

FIG. 3 shows a behavior model of the relationship between the input signal SI and the first control signal SC1 in accordance with the embodiment of the invention. According to the embodiment of the invention, the behavior model 301 shown in FIG. 3 is the logic equation of SC=(X1×X2)+(X3×X4). It is much easier and faster for the microprocessor 120 to verify the relationship between the input signal SI and the first control signal SC1 through a calculation of the behavior model 301.

In Step S6 of FIG. 2, the microprocessor 120 determines that the first signal X1 is "1" and the second signal X2 is "0" for the power-management system 110 operating under the power configuration SP. After inserting the first signal X1 and the second signal X2 into the logic equation, the first control signal SC1 is then determined by the third signal X3 and the fourth signal X4, since the first signal X1 and the second signal X2 can't make sure the first control signal SC1 is "1", such that the microprocessor 120 is now in Step S10 of FIG. 2.

Then, the microprocessor 120 notifies the designer either to modify the state of the input signal SI or to modify the behavior of the controller 111, i.e., to modify the logic equation, for the power-management system operating under the power configuration SP. Therefore, the control logic of the controller 111 is efficiently verified.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A method for verifying a power-management system comprising a controller and a plurality of power devices, wherein the controller receives a plurality of input signals to generate a plurality of control signals to control the power devices, comprising:

determining each of the power devices operating in a corresponding mode when the power-management operates under a power configuration;

determining a target combination of the control signals when each of the power devices operates in the corresponding mode;

patternlessly verifying a behavior of the controller with an input combination of the input signals for the power-management system operating under the power configuration to generate a calculated result of the control signals, wherein patternless verification is the generation of the calculated result of the control signals based on a logic equation that is equivalent to a behavior of the controller;

comparing the calculated result to the target combination;

determining that the input combination is valid when the calculated result is equal to the target combination; and selectively modifying either the input combination or the behavior of the controller based on the determined validity.

2. The method of claim 1, further comprising:

determining that the input combination is invalid when the calculated result is not equal to the target combination; and wherein the input combination or the behavior of the controller is modified to make the calculated result equal to the target combination.

3. The method of claim 1, wherein the step of patternlessly verifying the behavior of the controller comprises:

generating a logic equation equivalent to the behavior of the controller;

determining the input combination of the input signals for the power-management system operating under the power configuration; and generating the calculated result of the control signals according to the logic equation and the input combination.

4. The method of claim 3, wherein the logic equation models the behavior that the controller receives the input signals to generate the corresponding control signals.

5. The method of claim 3, wherein the logic equation is generated according to a logic function of the controller.

6. The method of claim 1, wherein the step of determining the target combination of the control signals comprises:

accessing a lookup table, wherein the lookup table lists all operation modes of each of the power devices and the corresponding control signals; and determining the target combination by the lookup table and the corresponding mode.

7. The method of claim 1, wherein each of the power devices is either a power switch or a voltage regulator.

8. The method of claim 7, wherein the voltage regulator is a low-dropout regulator or a DC-DC switched-mode voltage regulator.

9. A method for verifying a power-management system comprising a controller, a first power device and a second power device, wherein the controller receives a plurality of input signals to generate a plurality of first control signals to control the first power device and to generate a plurality of second control signals to control the second power device, comprising:

determining the first power device operating in a first mode and the second power device operating in a second mode when the power-management operates under a power configuration;

determining a first target combination of the first control signals when the first power device operates in the first mode;

determining a second target combination of the second control signals when the second power device operates in the second mode;

patternlessly verifying a behavior of the controller with an input combination of the input signals for the power-management system operating under the power configuration to generate a first calculated result of the first control signals and a second calculated result of the second control signals, wherein patternless verification is the generation of the calculated result of the control signals based on a logic equation that is equivalent to a behavior of the controller;

comparing the first calculated result to the first target combination;

comparing the second calculated result to the second target combination;

determining that the input combination is valid when the first and second calculated results are respectively equal to the first and second target combinations; and selectively modifying either the input combination or the behavior of the controller based on the determined validity.

10. The method of claim 9, further comprising:

determining that the input combination is invalid when either the first calculated result or the second calculated result is not equal to the corresponding first and second target combinations; and wherein the input combination or the behavior of the controller is modified to make the first calculated result and the second calculated result respectively equal to the first target combination and the second target combination.

11. The method of claim 9, wherein the step of patternlessly verifying the behavior of the controller comprises:

generating a logic equation equivalent to the behavior of the controller;

determining the input combination of the input signals for the power-management system operating under the power configuration;

generating the first calculated result of the first control signals according to the logic equation and the input combination; and generating the second calculated result of the second control signals according to the logic equation and the input combination.

12. The method of claim 11, wherein the logic equation models the behavior that the controller receives the input signals to generate the corresponding first and second control signals.

13. The method of claim 9, wherein the step of determining the first target combination of the first control signals comprises:

accessing a first lookup table, wherein the first lookup table lists all operation modes of the first power devices and the corresponding first control signals; and determining the first target combination by the first lookup table and the corresponding first mode.

14. The method of claim 9, wherein the step of determining the second target combination of the second control signals comprises:

accessing a second lookup table, wherein the second lookup table lists all operation modes of the second power devices and the corresponding second control signals; and determining the second target combination by the second lookup table and the corresponding second mode.

15. The method of claim 9, wherein each of the first and second power devices is either a power switch or a voltage regulator.

16. The method of claim 15, wherein the voltage regulator is a low-dropout regulator or a DC-DC switched-mode voltage regulator.

17. A verification device, comprising:

a power-management system, operating under a power configuration, wherein the power-management system comprises:

a controller, receiving a plurality of input signals to generate a plurality of first control signals and a plurality of second control signals;

a first power device, operating in a first mode according to the first control signal;

a second power device, operating in a second mode according to the second control signals; and a microprocessor, determining a first target combination of the first control signals when the first power device operates in the first mode, determining a second target combination of the second control signals when the second power device operates in the second mode, patternlessly verifying a behavior of the controller with an input combination of the input signals for the power-management system operating under the power configuration to generate a first calculated result of the first control signals and a second calculated result of the second control signals, comparing the first calculated result to the first target combination, comparing the second calculated result to the second target combination, determining that the input combination is valid when the first and second calculated results are respectively equal to the first and second target combinations, and selectively modifying either the input combination or the behavior of the controller based on the determined validity, wherein patternless verification is the generation of the calculated result of the control signals based on a logic equation that is equivalent to a behavior of the controller.

18. The verification device of claim 17, wherein the microprocessor determines that the input combination is invalid when either the first calculated result or the second calculated result is not equal to the corresponding first and second target combinations, wherein the input combination or the behavior of the controller is modified to make the first calculated result and the second calculated result respectively equal to the first target combination and the second target combination.

19. The verification device of claim 17, wherein the microprocessor generates a logic equation equivalent to the behavior of the controller, determines the input combination of the input signals for the power-management system operating under the power configuration, generates the first calculated result of the first control signals according to the logic equation and the input combination, and generates the second calculated result of the second control signals according to the logic equation and the input combination.

20. The verification device of claim 19, wherein the logic equation models the behavior that the controller receives the input signals to generate the corresponding first and second control signals.

21. The verification device of claim 17, wherein the microprocessor further accesses a first lookup table and determines the first target combination by the first lookup table and the corresponding first mode, wherein the first lookup table lists all operation modes of the first power devices and the corresponding first control signals.

22. The verification device of claim 17, wherein the microprocessor further accesses a second lookup table and determines the second target combination by the second lookup table and the corresponding second mode, wherein the second lookup table lists all operation modes of the second power devices and the corresponding second control signals.

23. The verification device of claim 17, wherein each of the first and second power devices is either a power switch or a voltage regulator.

24. The verification device of claim 23, wherein the voltage regulator is a low-dropout regulator or a DC-DC switched-mode voltage regulator.

* * * * *